United States Patent
Tripathi

(10) Patent No.: US 11,451,240 B2
(45) Date of Patent: Sep. 20, 2022

(54) DOUBLE DATA RATE (DDR) QUAD SWITCHED MULTIBIT DIGITAL TO ANALOG CONVERTER AND CONTINUOUS TIME SIGMA-DELTA MODULATOR

(71) Applicant: STMicroelectronics International N.V., Geneva (CH)

(72) Inventor: Vivek Tripathi, Greater Noida (IN)

(73) Assignee: STMicroelectronics International N.V., Geneva (CH)

( * ) Notice: Subject to any disclaimer, the term of this patent is extended or adjusted under 35 U.S.C. 154(b) by 0 days.

(21) Appl. No.: 17/344,450

(22) Filed: Jun. 10, 2021

(65) Prior Publication Data

US 2022/0029636 A1 Jan. 27, 2022

Related U.S. Application Data

(60) Provisional application No. 63/054,317, filed on Jul. 21, 2020.

(51) Int. Cl.
*H03M 7/16* (2006.01)
*H03M 1/06* (2006.01)
*H03M 3/00* (2006.01)

(52) U.S. Cl.
CPC ......... *H03M 7/165* (2013.01); *H03M 1/0665* (2013.01); *H03M 3/424* (2013.01); *H03M 3/454* (2013.01); *H03M 3/464* (2013.01)

(58) Field of Classification Search
CPC .... H03M 7/165; H03M 1/0665; H03M 3/424; H03M 3/454; H03M 3/464; H03M 3/37; H03M 3/44
(Continued)

(56) References Cited

U.S. PATENT DOCUMENTS

| 5,283,580 A | 2/1994 | Brooks et al. |
| 7,242,337 B2 | 7/2007 | Uemori et al. |

(Continued)

OTHER PUBLICATIONS

Breems, "A 2.2 GHz Continuous-Time ΔΣ ADC With −102 dBc THD and 25 MHz Bandwidth", IEEE Journal of Solid-State Circuits, vol. 51, Issue: 12, Dec. 2016.
(Continued)

*Primary Examiner* — Khai M Nguyen
(74) *Attorney, Agent, or Firm* — Crowe & Dunlevy

(57) ABSTRACT

A quad signal generator circuit generates four $2^N-1$ bit control signals in response to a $2^N-1$ bit thermometer coded signal. A digital-to-analog converter (DAC) circuit has $2^N-1$ unit DAC elements, with each unit DAC element including four switching circuits controlled by corresponding bits of the four $2^N-1$ bit control signals. Outputs of the $2^N-1$ unit DAC elements are summed to generate an analog output signal. The quad signal generator circuit controls a time delay applied to clock signals relative to the $2^N-1$ bit thermometer coded signal and a time delay applied to the $2^N-1$ bit thermometer coded signal relative to the delayed clock signals in logically generating the four $2^N-1$ bit control signals. The analog output signal may be a feedback signal in a sigma-delta analog-to-digital converter (ADC) circuit that includes a multi-bit quantization circuit operating to quantize a filtered loop signal to generate the $2^N-1$ bit thermometer coded signal.

23 Claims, 6 Drawing Sheets

(58) Field of Classification Search
USPC .......................................... 341/143–144, 155
See application file for complete search history.

(56) References Cited

U.S. PATENT DOCUMENTS

| | | | |
|---|---|---|---|
| 7,456,766 | B2 | 11/2008 | Keehr |
| 8,306,106 | B2 | 11/2012 | Alexander et al. |
| 8,319,674 | B2 | 11/2012 | Loeda et al. |
| 9,378,184 | B2 * | 6/2016 | Han .................... H03M 1/0665 |
| 9,379,728 | B1 | 6/2016 | Singh et al. |
| 9,537,514 | B2 | 1/2017 | Talty et al. |
| 9,584,151 | B1 | 2/2017 | Manganaro et al. |
| 9,787,316 | B2 | 10/2017 | Shu |
| 10,050,640 | B1 * | 8/2018 | Bal .................... H03M 1/0665 |
| 10,148,277 | B1 | 12/2018 | Singh et al. |
| 10,790,842 | B1 | 9/2020 | Paussa et al. |
| 10,965,302 | B1 | 3/2021 | Zhao et al. |
| 2004/0004511 | A1 | 1/2004 | Kao |
| 2007/0188362 | A1 | 8/2007 | Koerrer et al. |
| 2008/0309541 | A1 | 12/2008 | Pelgrom et al. |
| 2015/0061908 | A1 | 3/2015 | Rajasekhar et al. |
| 2015/0171878 | A1 | 6/2015 | Schafferer et al. |
| 2020/0076446 | A1 | 3/2020 | Egan |

OTHER PUBLICATIONS

Engel, "A 14b 3/6GHz current-steering RF DAC in 0.18 μm CMOS with 66dB ACLR at 2.9GHz", 2012 IEEE International Solid-State Circuits Conference, pp. 2906-2916.

Park, Sungkyung, et al: "A Digital-to-Analog Converter Based on Differential-Quad Switching," IEEE Journal of Solid-State Circuits, vol. 37, No. 10, Oct. 2002, pp. 1335-1338.

Sukimaran, Amrith, et al: "Design of Continuous-Time Modulators With Dual Switched-Capacitor Return-to-Zero DACs," IEEE Journal of Solid-State Circuits, vol. 51, No. 7, Jul. 2016, pp. 1619-1629.

* cited by examiner

DOUBLE DATA RATE (DDR) QUAD SWITCHED MULTIBIT DIGITAL TO ANALOG CONVERTER AND CONTINUOUS TIME SIGMA-DELTA MODULATOR

CROSS REFERENCE TO RELATED APPLICATIONS

This application claims priority from U.S. Provisional Application for Patent No. 63/054,317, filed Jul. 21, 2020, the disclosure of which is incorporated by reference.

TECHNICAL FIELD

The present invention generally relates to a digital-to-analog converter (DAC) circuit and, in particular, to a multibit DAC circuit for use in a continuous time (CT) sigma-delta (SD) modulator circuit.

BACKGROUND

FIG. 1 shows a time domain block diagram of a conventional continuous time (CT) sigma-delta (SD) analog-to-digital converter (ADC) circuit 10. The circuit 10 includes a continuous time sigma-delta modulator circuit 12 (illustrated here as a first-order circuit) having an input configured to receive an analog input signal A and an output configured to generate a digital output signal B. The first order implementation of the sigma-delta modulator circuit 12 comprises a difference amplifier 20 (or summation circuit) having a first (non-inverting) input that receives the analog input signal A and a second (inverting) input that receives an analog feedback signal D. The difference amplifier 20 outputs an analog difference signal vdif in response to a difference between the analog input signal A and the analog feedback signal D (i.e., vdif(t)=A(t)−D(t)). The analog difference signal vdif is integrated by an integrator circuit 22 (a first order loop filter) to generate a change signal vc having a slope and magnitude that is dependent on the sign and magnitude of the analog difference signal vdif. A quantization circuit 24 samples the change signal vc at the sampling rate fs set by the sampling clock CLK and generates the digital output signal B as a $2^N-1$ bit thermometer coded output word for each sample (where N is an integer N>1, for example, N=4). The circuit 10 further includes a decimator circuit 14 that functions to low pass filter and down sample the $2^N-1$ bit thermometer code words in the stream of the digital output signal B to generate a digital signal C comprised of the stream of multi-bit (M-bit, i.e., the required resolution where M is an integer M>>N) digital words are generated at an output word rate fd set by a decimation factor.

A multi-bit digital-to-analog converter (DAC) circuit 26 in the feedback loop converts the digital output signal B to a corresponding analog signal level for the analog feedback signal D. The DAC circuit 26 is a resistive circuit that includes $2^N-1$ unit resistive DAC elements (UE) that are respectively driven by the $2^N-1$ bits of the thermometer code word of the digital output signal B, with current outputs from the driven unit resistive DAC elements being summed at the DAC circuit output to generate an analog signal level for the analog feedback signal D.

The use of multi-bit quantization presents a number of advantages including: permitting operation of the modulator to achieve a given resolution using a lower sampling rate fs; or permitting operation of the modulator to achieve a higher resolution for a given sampling rate fs. A key characteristic of the sigma-delta modulator circuit 12 is its ability to push the quantization noise due to operation of the quantization circuit 24 to higher frequencies away from the signal of interest. This is known in the art as noise shaping. The decimator circuit 14 can then be implemented with a low-pass filtering characteristic (i.e., frequency response) to substantially remove the high frequency components of the shaped quantization noise.

The use of multi-bit quantization in sigma-delta modulator circuits, however, is difficult because of the inherent mismatch present in the $2^N-1$ unit resistive DAC elements of the DAC circuit 26 in the feedback loop. As is known by those skilled in the art, this DAC mismatch translates directly into non-linearity of the entire modulator 12. This non-linearity is due, for example, to the existence of unequal analog signal output steps (i.e., due to mismatch between the $2^N-1$ unit resistive DAC elements) of the multi-bit DAC circuit).

As a result of the non-linearity introduced in the analog output of the DAC circuit 26 due to the mismatch between unit resistive DAC elements, there will be an increase in the noise floor as well as increased harmonic distortion within the desired signal band with respect to the modulator output spectrum. The DAC non-linearity also modulates the quantization noise of the quantization circuit 24 into the signal band resulting in a degraded signal-to-noise ratio (SNR) and signal-to-noise and distortion ratio (SNDR).

With reference now to FIG. 2, it is known in the art to address the issue of DAC non-linearity in a multi-bit quantization implementation by employing a circuit 30 in the feedback loop that implements a data weighted averaging (DWA) algorithm in order to achieve first order mismatch shaping with respect to the $2^N-1$ unit resistive DAC elements. The circuit 30 receives the series of $2^N-1$ bit thermometer code words output from the quantization circuit 24 and generates a series of $2^N-1$ bit control words for actuating the $2^N-1$ unit resistive DAC elements of the DAC circuit 26 so that over time all of the $2^N-1$ unit resistive DAC elements will be relatively equally actuated in generating the analog feedback signal D.

The execution of the DWA algorithm introduces a processing delay into the signal processing loop that is in addition to the quantization delay. It is important that the total delay, referred to as the excess loop delay (ELD), not exceed one period Ts of the sampling clock CLK because this could lead to modulator instability. Indeed, it is preferred that the ELD satisfy the following constraint: 0.5Ts<ELD<0.75Ts.

The DWA modifies the switching of DAC elements so that the DAC elements are switching at every clock cycle. So, the switching in the DAC is not thermometric. As a result, non-linear glitch energy and data dependent switching (in response to DWA) can introduce significant distortion in the output of the modulator. A solution to this problem is to perform quad switching of the DAC. One option is to use half data rate (HDR) quad switching. However, the purpose of the DWA to nullify the effects of mismatch in the DAC elements through first order mismatch shaping is not fully utilized with HDR quad switching. There is some residual distortion remaining in the modulator output due to mismatch. It is noted that this residual distortion arises due to the fact that there are an unequal number of times that the resistors of the DAC switching circuits are being selected with HDR quad switching. The selection of the resistor by the switching transistor is dependent on the data pattern, which is clearly evident from the timing diagram shown in FIG. 6B.

Quad switching signal generation circuits can introduce glitches in the control signals resulting in severe harmonic distortion of the modulator output. Prior art solutions address this concern by latching the control signals. The signal latching operation, however, will further increase delay and risk an unacceptable level of ELD leading to instability. In this regard, it is noted that continuous time delta-sigma modulators operating in the GHz sampling frequency (fs) range as shown herein include a feedback path with a quantizer, DWA, quad signal generator and DAC. It is difficult enough to ensure ELD with 0.5Ts<ELD<0.75Ts (where Ts=1/fs) in the feedback path with this configuration, but the addition of the latching circuits for the quad switching signals will add further signal delay and jeopardize the ability to meet the ELD performance requirements.

There is accordingly a need in the art to address the foregoing problems.

SUMMARY

The present invention utilizes a double data rate (DDR) quad switching of the DAC. The generation of the quad switching signals is controlled in order to ensure that the excess loop delay (ELD) requirements are satisfied and further that no glitches are present.

In an embodiment, a circuit comprises: a digital-to-analog converter (DAC) circuit having $2^N-1$ unit resistive DAC elements, wherein each unit resistive DAC element includes four switching circuits controlled by corresponding bits of four $2^N-1$ bit control signals, wherein outputs of the $2^N-1$ unit resistive DAC elements are summed to generate an analog output signal; and a quad signal generator circuit configured to generate the four $2^N-1$ bit control signals in response to a $2^N-1$ bit thermometer coded input signal.

In an embodiment, the quad signal generator circuit comprises: a clock phase circuit configured to generate first and second clock signals that are 180° out of phase with each other and apply a first delay to set clock edges of the first and second clock signals to trail logic switching of the $2^N-1$ bit thermometer coded input signal; a first circuit configured to logically combine the $2^N-1$ bit thermometer coded input signal with the first clock signal to generate a first one of the four $2^N-1$ bit control signals; a second circuit configured to logically combine a delay of the $2^N-1$ bit thermometer coded input signal with the second clock signal to generate a second one of the four $2^N-1$ bit control signals, wherein the second circuit applies a second delay to set the logic switching of the delayed $2^N-1$ bit thermometer coded input signal to trail the clock edges of the first and second clock signals; a third circuit configured to logically combine a logical inversion of the $2^N-1$ bit thermometer coded input signal with the first clock signal to generate a third one of the four $2^N-1$ bit control signals; and a fourth circuit configured to logically combine a delay of the logical inversion of the $2^N-1$ bit thermometer coded input signal with the second clock signal to generate a fourth one of the four $2^N-1$ bit control signals, wherein the fourth circuit applies a third delay to set the logic switching of the delayed logical inversion of the $2^N-1$ bit thermometer coded input signal to trail the clock edges of the first and second clock signals.

BRIEF DESCRIPTION OF THE DRAWINGS

For a better understanding of the embodiments, reference will now be made by way of example only to the accompanying figures in which.

DETAILED DESCRIPTION

Figure 1:
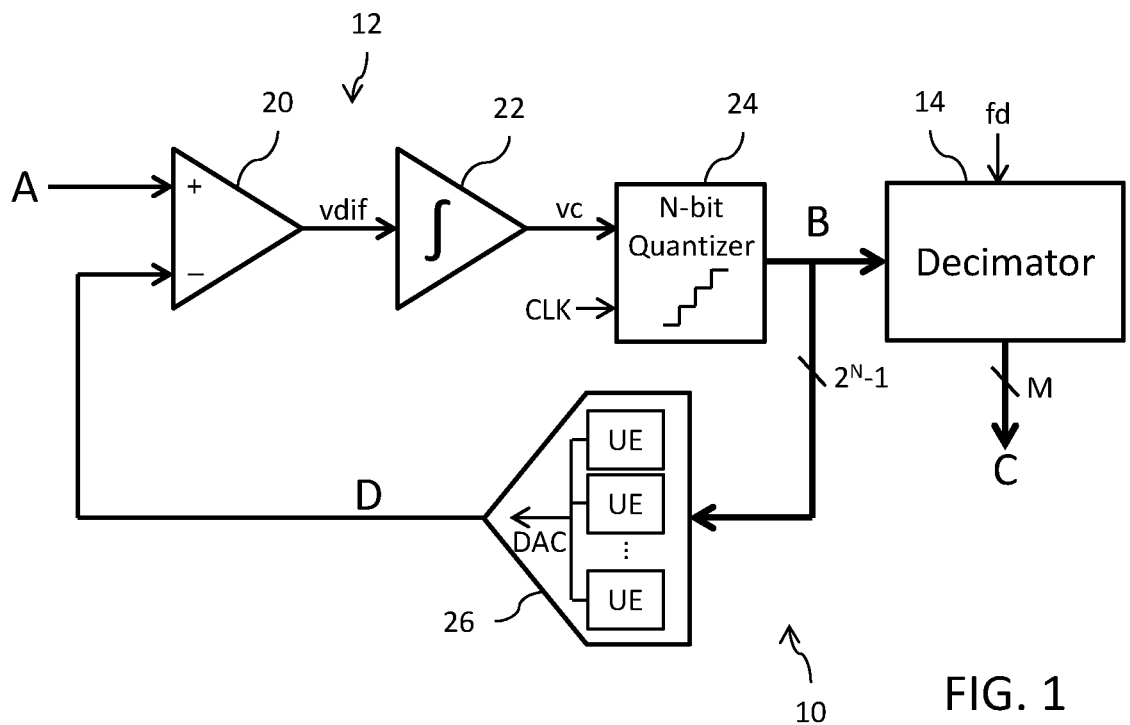
FIG. 1 is a time domain block diagram of a conventional sigma-delta analog-to-digital converter circuit with multi bit quantization.
Figure 2:
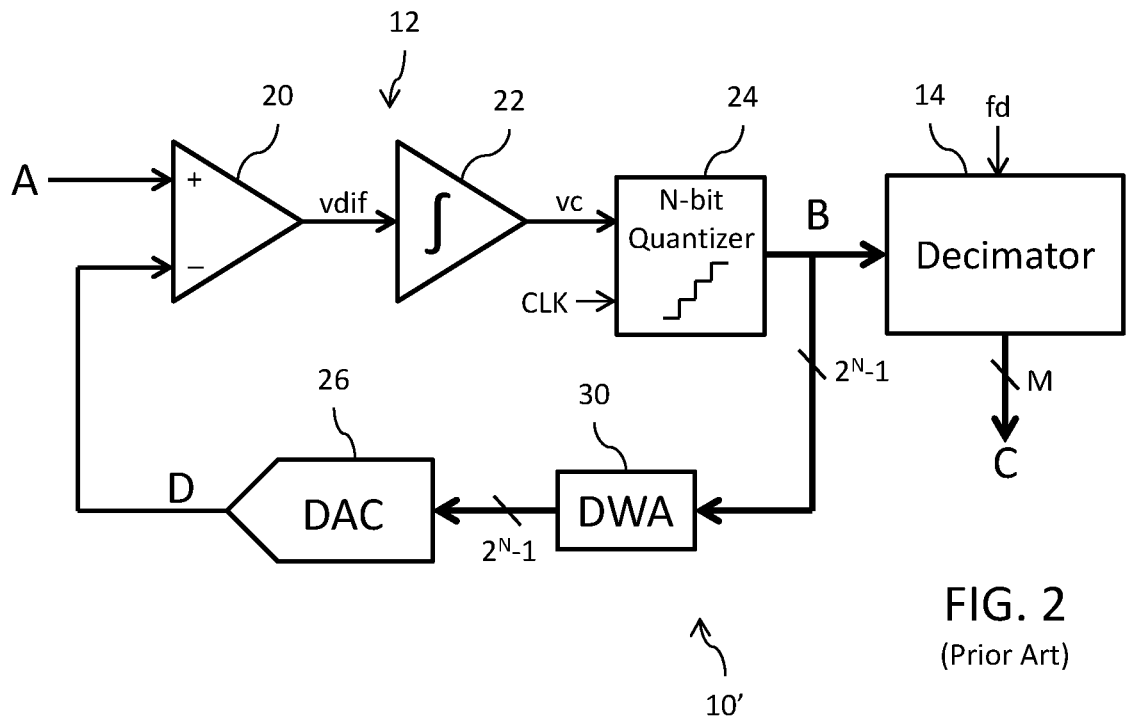
FIG. 2 is a time domain block diagram of a conventional sigma-delta analog-to-digital converter circuit with multi bit quantization and data weighted averaging.
Figure 3A:
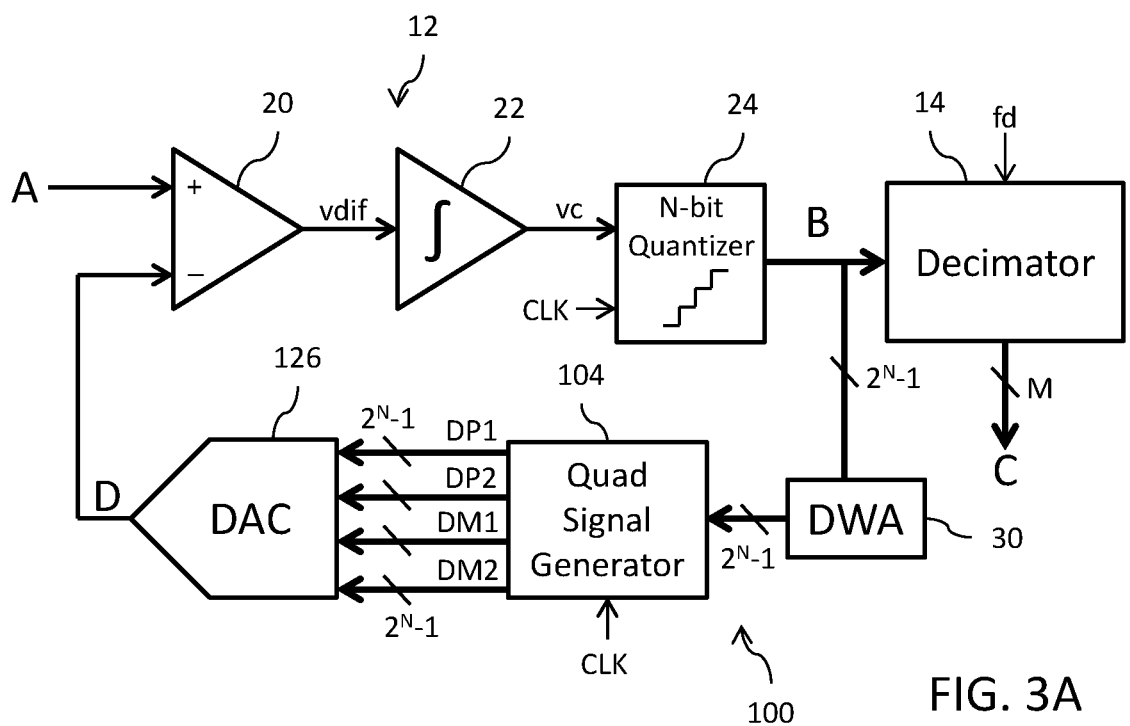
FIG. 3A is a time domain block diagram of a continuous time sigma-delta analog-to-digital converter circuit with a multi bit quantizer, data weighted averaging and a quad signal generator controlling a quad switched digital-to-analog converter.

Reference is now made to FIG. 3A which shows a time domain block diagram of a continuous time sigma-delta analog-to-digital converter (modulator) circuit 100 with a multi bit quantizer, data weighted averaging and a quad signal generator controlling a quad switched digital-to-analog converter. The circuit 100 includes a continuous time sigma-delta modulator circuit 12 (illustrated here as a first-order circuit, but it being understood that the loop filter of the modulator can be of any order suited to the circuit application requirements; see, FIG. 3B) having an input configured to receive an analog input signal A and an output configured to generate a digital output signal B comprised of a stream of multi-bit thermometer coded data words. The thermometer coded values in the pulse stream of the signal B at a sampling rate fs are processed in a decimator circuit 14 (comprising a low pass filter and down sampler) to generate an equivalent digital signal C of the input signal A with a required resolution and a required output word rate fd, where fd<<fs, set by a decimation factor.

The first order sigma-delta modulator circuit 12 comprises a difference amplifier 20 (or summation circuit) having a first (non-inverting) input that receives the analog input signal A and a second (inverting) input that receives an analog feedback signal D. The difference amplifier 20 outputs an analog difference signal vdif in response to a difference between the analog input signal A and the analog feedback signal D (i.e., vdif(t)=A(t)−D(t)). The analog difference signal vdif is integrated by an integrator circuit 22 (of the loop filter, here of first order type, without limitation) to generate a change signal vc having a slope and magnitude that is dependent on the sign and magnitude of the analog difference signal vdif. An N-bit quantization circuit 24 samples the change signal vc in response to a clock CLK at the sampling rate fs and generates the digital output signal B as a $2^N-1$ bit thermometer coded output word for each sample (where N is an integer N>1). A circuit 30 that implements a data weighted averaging (DWA) algorithm receives the $2^N-1$ bit thermometer coded output word and outputs a $2^N-1$ bit output DWA word providing for first order mismatch shaping of DAC elements. A quad signal generator circuit 104 receives the $2^N-1$ bit output DWA word and the sampling clock CLK and generates four $2^N-1$ bit control words DP1, DP2, DM1 and DM2 whose data values change at the same rate as the rate of the sampling clock CLK. A DAC circuit 126 includes $2^N-1$ unit resistive DAC elements (UE) that are respectively driven by corresponding bits of the $2^N-1$ bits of the control words DP1, DP2, DM1 and DM2 to generate currents which are summed at the output of the DAC circuit to produce an analog signal for the analog feedback signal D. The decimator circuit 14 low pass filters and down samples the $2^N-1$ bit code words in the stream of the digital output signal B to generate a digital signal C comprised of the stream of multi-bit (M-bit, the required resolution, where is an integer M>>N) digital words are generated at an output word rate fd set by a decimation factor.

Figure 3B:
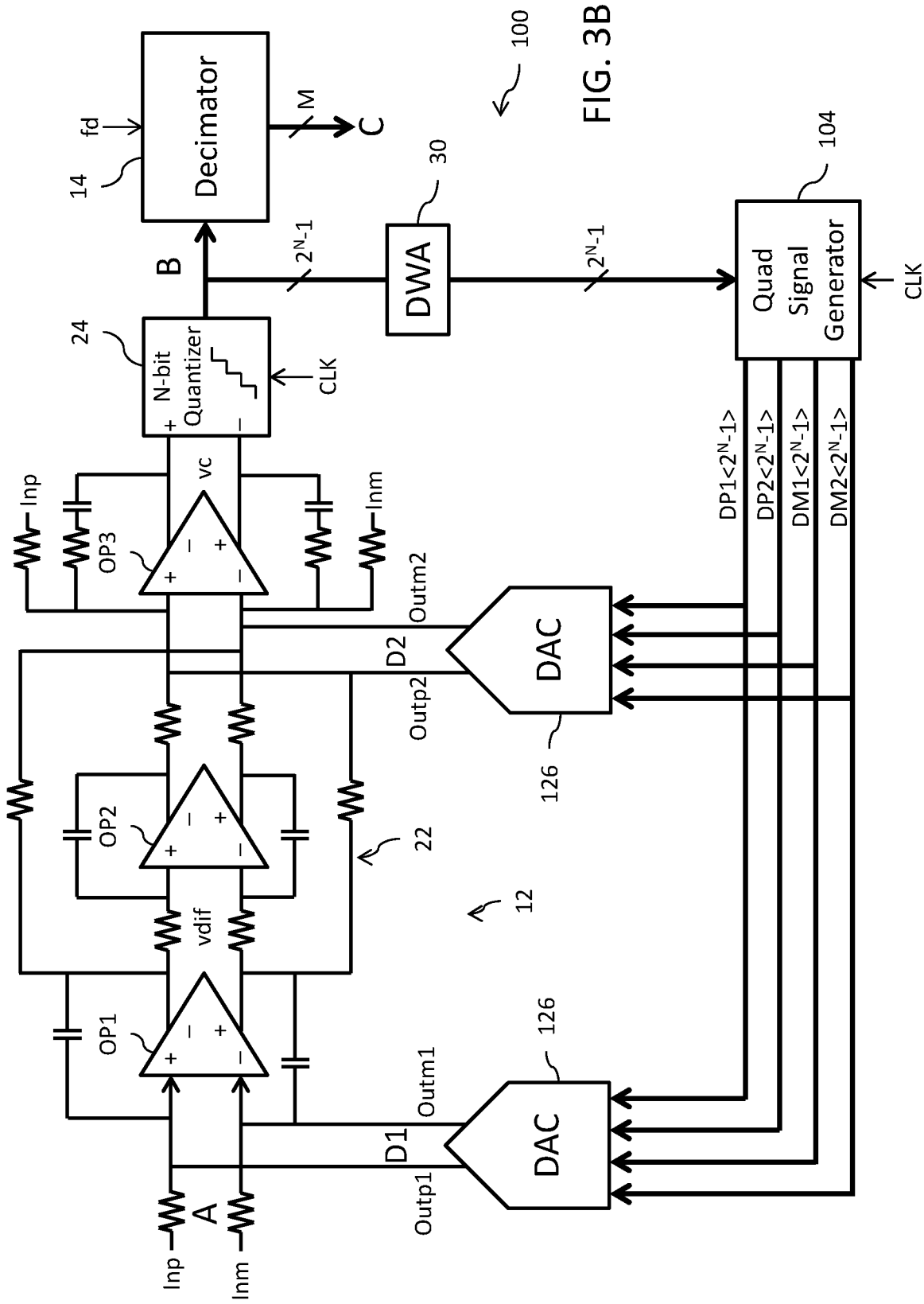
FIG. 3B is a circuit diagram for a differential signal implementation of the circuit of FIG. 3A using a third-order modulator.

The implementation illustrated in FIG. 3A is a simplification. In a preferred implementation, the analog signal processing portions of the circuit 100 are constructed as fully differential circuits. FIG. 3B shows a circuit diagram for a differential signal implementation of the circuit of FIG. 3A using a third-order modulator. The loop filter is formed by operational amplifiers OP1, OP2 and OP3 to provide the difference amplifier 20 and integrator circuit 22 for the third-order implementation of the sigma-delta modulator circuit 12 in a configuration with cascaded integrators having feed forward as well as feedback (CIFF-FB). Because of the choice for a third-order implementation with CIFF-FB, two DACs 126 are needed. Each DAC 126 receives the $2^N-1$ bits of the control words DP1, DP2, DM1 and DM2 output from the quad signal generator circuit 104 and provides the differential output signal D (Outm and Outp). The operational amplifier OP1 receives the signals A (Inm and Inp) and D1 (Outm1 and Outp1 from one of the DACs) as differential signals. The operational amplifier OP3 receives the signal D2 (Outm2 and Outp2 from the other of the DACs) as a differential signal in combination with the differential signal output from the operational amplifier OP2 and the differential input signal A (Inp and Inm). The quantization circuit 24 receives the signal vc output from the integrator circuit 22 as a differential signal.

Figure 4:
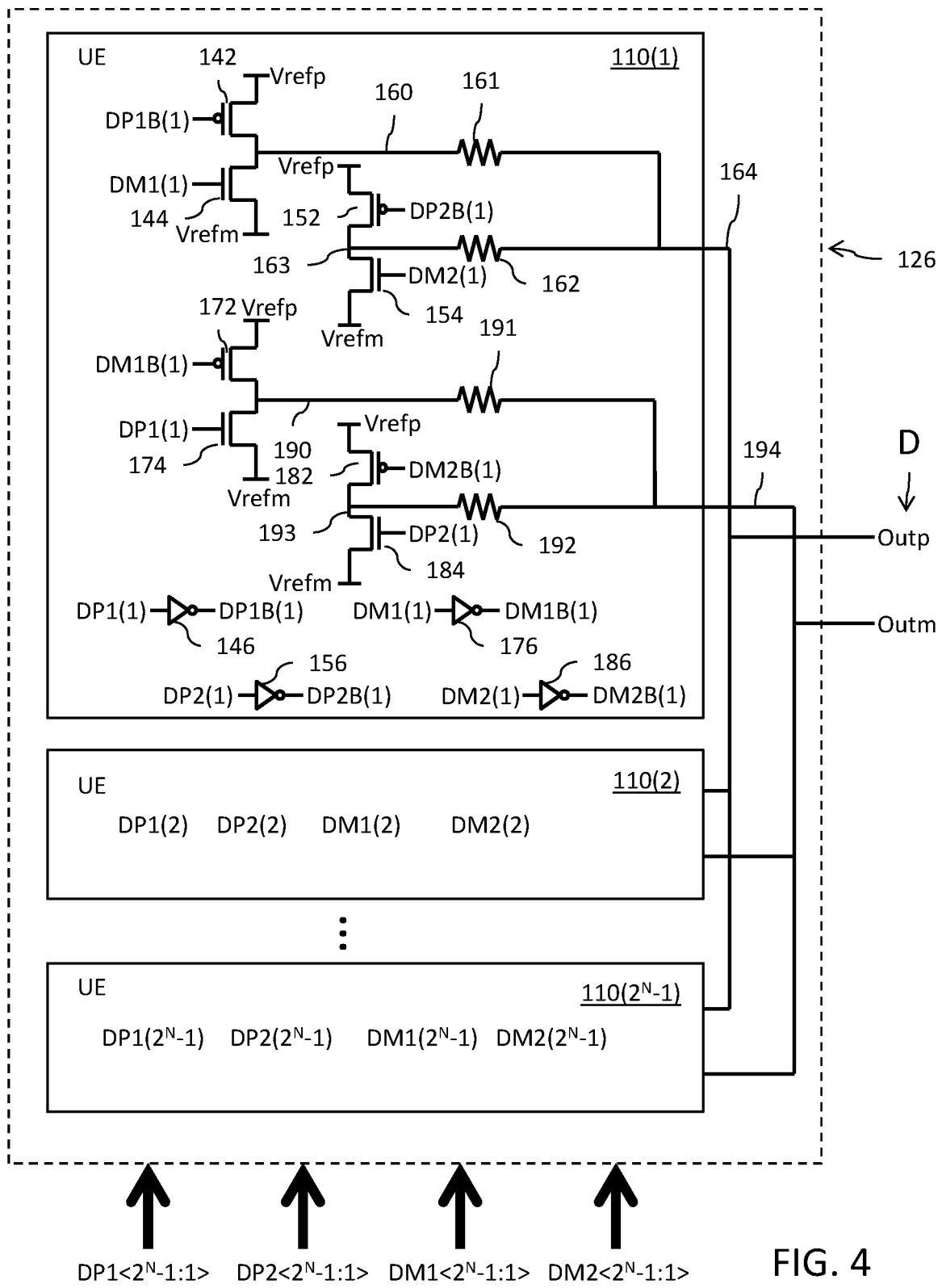
FIG. 4 is a block diagram of a digital-to-analog converter (DAC) circuit in differential signaling form.

In the differential signaling context as shown in FIG. 3B, FIG. 4 shows a block diagram of the DAC circuit 126 as a differential circuit. The DAC circuit 126 includes $2^N-1$ unit resistive DAC elements (UE) 110(1)-110($2^N-1$) that are selectively actuated in response to the control word output of the quad signal generator circuit 104 to generate the analog feedback signal D. Each unit resistive DAC element 110 receives the corresponding bit from each of the control words DP1<$2^N-1$:1>, DP2<$2^N-1$:1>, DM1<$2^N-1$:1> and DM2<$2^N-1$:1>. For example, unit resistive DAC element 110(1) receives the first bits DP1(1), DP2(1), DM1(1) and DM2(1), unit resistive DAC element 110(2) receives the second bits DP1(2), DP2(2), DM1(2) and DM2(2), . . . , and the unit resistive DAC element 110($2^N-1$) receives the $2^N-1$ th bits DP1($2^N-1$), DP2($2^N-1$), DM1($2^N-1$) and DM2($2^N-1$). The quad signal generator circuit 104 generates the bits of the control words DP1<$2^N-1$:1>, DP2<$2^N-1$:1>, DM1<$2^N-1$:1> and DM2<$2^N-1$:1> from the $2^N-1$ bit output DWA word in a manner to be described in detail herein. The bits of the control words DP1<$2^N-1$:1>, DP2<$2^N-1$:1>, DM1<$2^N-1$:1> and DM2<$2^N-1$:1> change at the same rate as the rate of the sampling clock CLK.

For each given one X, where X is from 1 to $2^N-1$, the unit resistive DAC element 110(X) includes a first CMOS inverter (switching) circuit formed by a pMOS transistor 142 and an nMOS transistor 144 whose source-drain paths are coupled in series between a first reference voltage Vrefp and a second reference voltage Vrefm. The first switching circuit switches between the first and second reference voltages in response to certain ones of the control words where: the gate of the pMOS transistor 142 receives the bit DP1B(X) which is the logical inversion (generated by inverter 146) of the bit DP1(X) of the control word DP1<$2^N-1$:1>. The gate of the nMOS transistor 144 receives the bit DM1(X) of the control word DM1<$2^N-1$:1>. The unit resistive DAC element 110(X) also includes a second CMOS inverter (switching) circuit formed by a pMOS transistor 152 and an nMOS transistor 154 whose source-drain paths are coupled in series between the first reference voltage Vrefp and the second reference voltage Vrefm. The second switching circuit switches between the first and second reference voltages in response to certain ones of the control words where: the gate of the pMOS transistor 152 receives the bit DP2B(X) (generated by inverter 156) which is the logical inversion of the bit DP2(X) of the control word DP2<$2^N-1$:1>. The gate of the nMOS transistor 124 receives the bit DM2(X) of the control word DM2<$2^N-1$:1>. The common drain terminals of the transistors 142 and 144 at node 160 are connected through a resistor 161 to a first output node 164 of the unit resistive DAC element 110(X). The common drain terminals of transistors 152 and 154 at node 163 are connected through a resistor 162 to the first output node 164 of the unit resistive DAC element 110(X). A first output current signal is generated at the first output node 164.

The unit resistive DAC element 110(X) further includes a third CMOS inverter (switching) circuit formed by a pMOS transistor 172 and an nMOS transistor 174 whose source-drain paths are coupled in series between the first reference voltage Vrefp and the second reference voltage Vrefm. The third switching circuit switches between the first and second reference voltages in response to certain ones of the control words where: the gate of the pMOS transistor 172 receives the bit DM1B(X) (generated by inverter 176) which is the logical inversion of the bit DM1(X) of the control word DM1<$2^N-1$:1>. The gate of the nMOS transistor 174 receives the bit DP1(X) of the control word DP1<$2^N-1$:1>. The unit resistive DAC element 110(X) also includes a fourth CMOS inverter (switching) circuit formed by a pMOS transistor 182 and an nMOS transistor 184 whose source-drain paths are coupled in series between the first reference voltage Vrefp and the second reference voltage Vrefm. The fourth switching circuit switches between the first and second reference voltages in response to certain ones of the control words where: the gate of the pMOS transistor 182 receives the bit DM2B(X) (generated by inverter 186) which is the logical inversion of the bit DM2(X) of the control word DM2<$2^N-1$:1>. The gate of the nMOS transistor 184 receives the bit DP2(X) of the control word DP2<$2^N-1$:1>. The common drain terminals of the transistors 172 and 174 at node 190 are connected through a resistor 191 to a second output node 194 of the unit resistive DAC element 110(X). The common drain terminals of transistors 182 and 184 at node 193 are connected through a resistor 192 to the second output node 194 of the unit resistive DAC element 110(X). A second output current signal is generated at the second output node 194.

The inclusion of a resistor (161, 162, 191, 192) in the output current path from each CMOS inverter (switching) circuit provides an operational advantage. It will be noted that the circuit nodes for the first reference voltage Vrefp and the second reference voltage Vrefm will typically be connected to external pins (pads) of the integrated circuit device. The reference voltages will be applied to these pins.

Because the circuit nodes are external, there will be some parasitic resistances in their paths. The use of separate output resistors for each CMOS inverter (switching) circuit, as opposed to the use of a shared resistance for each pair of CMOS inverter (switching) circuits, reduces the sensitivity of the dynamic performance of the modulator to the presence of the parasitic resistances.

The first reference voltage Vrefp and the second reference voltage Vrefm are selected by the circuit designer based on the design voltages for the circuit. In an embodiment, for example, the first reference voltage Vrefp=1.1V and the second reference voltage Vrefm=0V. Any suitable regulator voltage generator circuit can be used to provide first reference voltage Vrefp and the second reference voltage Vrefm.

The first output current signals generated at the first output nodes 164 of the unit resistive DAC elements 110 (1)-110($2^N$-1) are connected together at a summing node to generate a first net output DAC current providing a first component Outp of the differential analog feedback signal D. The second output current signals at the second output nodes 194 of the unit resistive DAC elements 110(1)-110 ($2^N$-1) are connected together at a summing node to generate a second net output DAC current providing a second component Outm of the differential analog feedback signal D. In this implementation, the analog feedback signal D is a differential current signal formed by the Outp and Outm components. The Outp and Outm components forming the analog feedback signal D are then input to the second (inverting) differential signal inputs of the difference amplifier 20. In the implementation of FIG. 3B, the Outp and Outm components forming the analog feedback signal D correspond to the components Outpx and Outmx of signal Dx (where x is 1 or 2 depending on the particular DAC).

Figure 5:
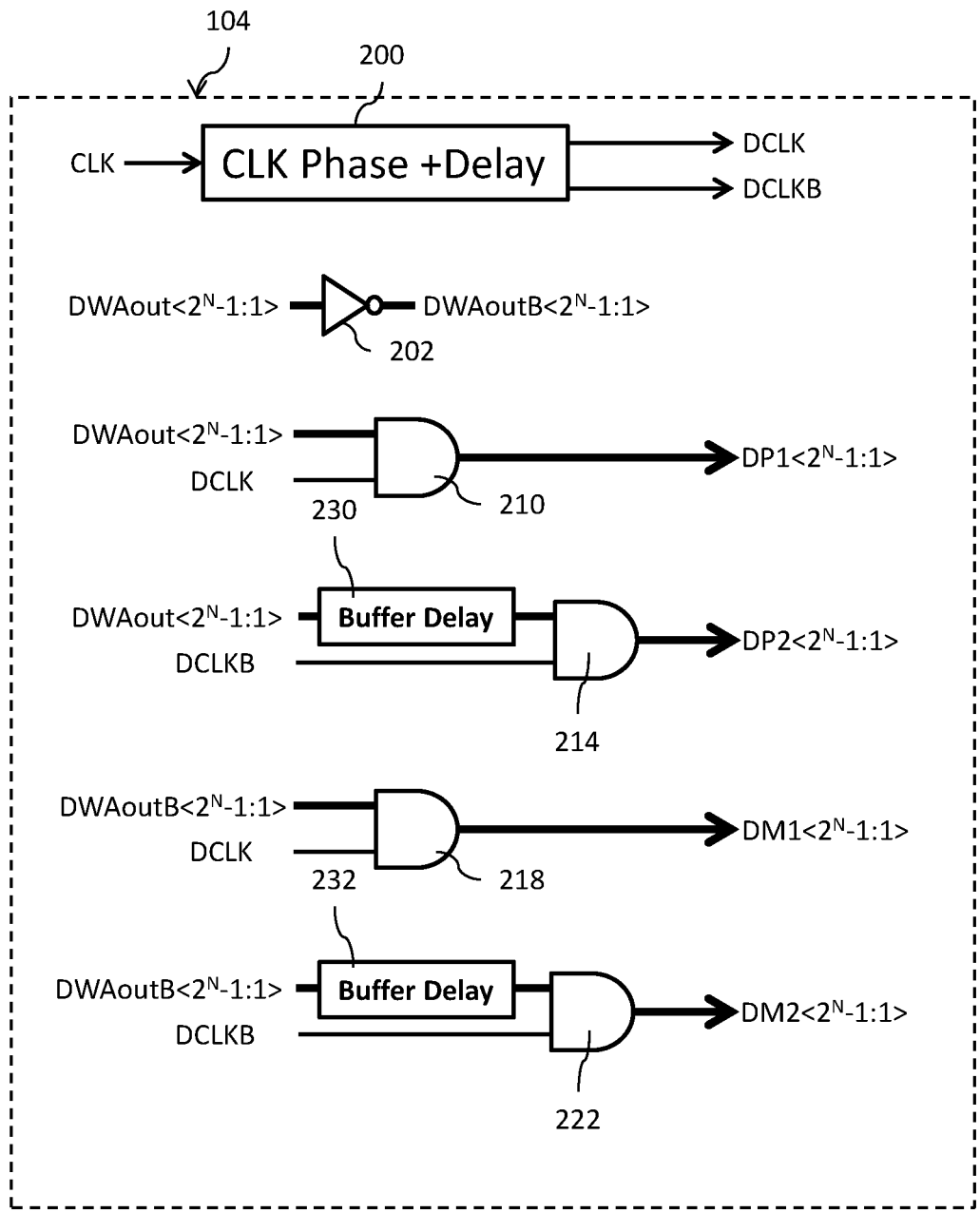
FIG. 5 is a block diagram of a quad signal generator circuit as used in with circuit of FIG. 4.

FIG. 5 shows a block diagram of the quad signal generator circuit 104. The sampling clock CLK input to the quad signal generator circuit 104 is processed by a clock phase circuit 200 to output a pair of 180° out of phase clock signals DCLK and DCLKB. In an embodiment, the clock DCLK and its logical inverse (i.e., 180° out of phase) clock DCLKB are at the same frequency as the sampling clock CLK. In another embodiment, the clock DCLK and its logical inverse (i.e., 180° out of phase) clock DCLKB are at a different frequency than the sampling clock CLK (for example, at half frequency with the quad signal generator circuit 104 further including a frequency divider to divide by two). The clock phase circuit 200 further applies a timing delay that ensures that the edges of the DCLK/DCLB clocks trail the switching edge transition of the DWAout<$2^N$-1:1> word. In other words, the temporally aligned edges of the DCLK/DCLB clocks lag by an amount of the timing delay the corresponding switching edge transition of the DWAout<$2^N$-1:1>word generated in response to the edge of the sampling clock CLK. The length of delay applied by the clock phase circuit 200 is less than one-half a clock period of the DCLK/DCLB clocks and, in particular, is less than one-half a clock period of the sampling clock CLK.

It is important to address concerns with timing misalignment in order to avoid the generation of glitches in the control signals DP1(X), DP2(X), DM1(X) and DM2(X). The quad signal generator circuit 104 is configured to control timing alignment by adjusting slight delays in the DWAout<$2^N$-1:1> word relative to the DCLK clock and/or DCLKB clock in order to ensure that no glitches are generated.

The $2^N$-1 bit output DWA word (DWAout<$2^N$-1:1>) received from the DWA circuit 102 is logically inverted by circuit 202 to generate an inverted $2^N$-1 bit output DWA word (DWAoutB<$2^N$-1:1>). The quad control words DP1<$2^N$-1:1>, DP2<$2^N$-1:1>, DM1<$2^N$-1:1> and DM2<$2^N$-1:1> are generated by logically combining the DWAout<$2^N$-1:1> word, DWAoutB<$2^N$-1:1> word, DCLK clock and DCLKB clock as follows. The control word DP1<$2^N$-1:1> is generated by logically ANDing 210 the DWAout<$2^N$-1:1> word with the DCLK clock. The control word DP2<$2^N$-1:1> is generated by delaying the DWAout<$2^N$-1:1> word using a buffer delay circuit 230 and logically ANDing 214 the delayed DWAout<$2^N$-1:1> word with the DCLKB clock. The control word DM1<$2^N$-1:1> is generated by logically ANDing 218 the DWAoutB<$2^N$-1:1> word with the DCLK clock. The control word DM2<$2^N$-1:1> is generated by delaying the DWAoutB<$2^N$-1:1> word using a buffer delay circuit 232 and logically ANDing 222 the delayed DWAoutB<$2^N$-1:1> word with the DCLKB clock.

In an embodiment, each of the buffer delay circuits 230 and 232 may comprise a plurality of series connected buffer/inverter circuits, where the number of such circuits sets the length of the applied signal delay. In each case, the buffer delay circuits 230 and 232 each apply a timing delay that ensures that the switching edge transition of the delayed DWAout<$2^N$-1:1> word trails the edges of the DCLK/DCLB clocks trail. In other words, the switching edge transition of the delayed DWAout<$2^N$-1:1> word lags by the length of the applied signal delay the temporally aligned edges of the DCLK/DCLB clocks. It will also be understood that the length of the applied signal delay may, in an embodiment, be dynamically controlled (for example, in response to voltage and temperature variation during circuit operation). Still further, the length of the applied signal delay may be set during a calibration operation to account for process variation. The length of delay applied by each of the buffer delay circuits 230 and 232 is typically identical and is less than one-half a clock period of the DCLK/DCLB clocks and, in particular, is less than one-half a clock period of the sampling clock CLK.

In a preferred implementation, a total length of a sum of the length of delay applied by the clock phase circuit 200 and the length of either delay applied by one of the buffer delay circuits 230 and 232 is less than one-half a clock period of the DCLK/DCLB clocks and, in particular, is less than one-half a clock period of the sampling clock CLK.

Delaying the DCLK/DCLB clocks to trail the switching edge transition of the DWAout<$2^N$-1:1> word ensures that there are no glitches in the control signals DP1(X) and DM1(X). The delays introduced by the buffer delay circuits 230, 232 further ensure that the switching edge transition of the delayed DWAout<$2^N$-1:1> word used in the generation of the control signals DP2(X) and DM2(X) trail the edges of the DCLK/DCLB clocks so that there are no glitches in the control signals DP2(X) and DM2(X). By exercising control over timing alignment, this solution obviates the need to latch the control signals DP1(X), DP2(X), DM1(X) and DM2(X) and supports operation where the excess loop delay (ELD) is maintained at less than one period Ts of the sampling clock CLK (it is preferred that the ELD satisfy the following constraint: $0.5Ts<ELD<0.75Ts$).

Figure 6A:
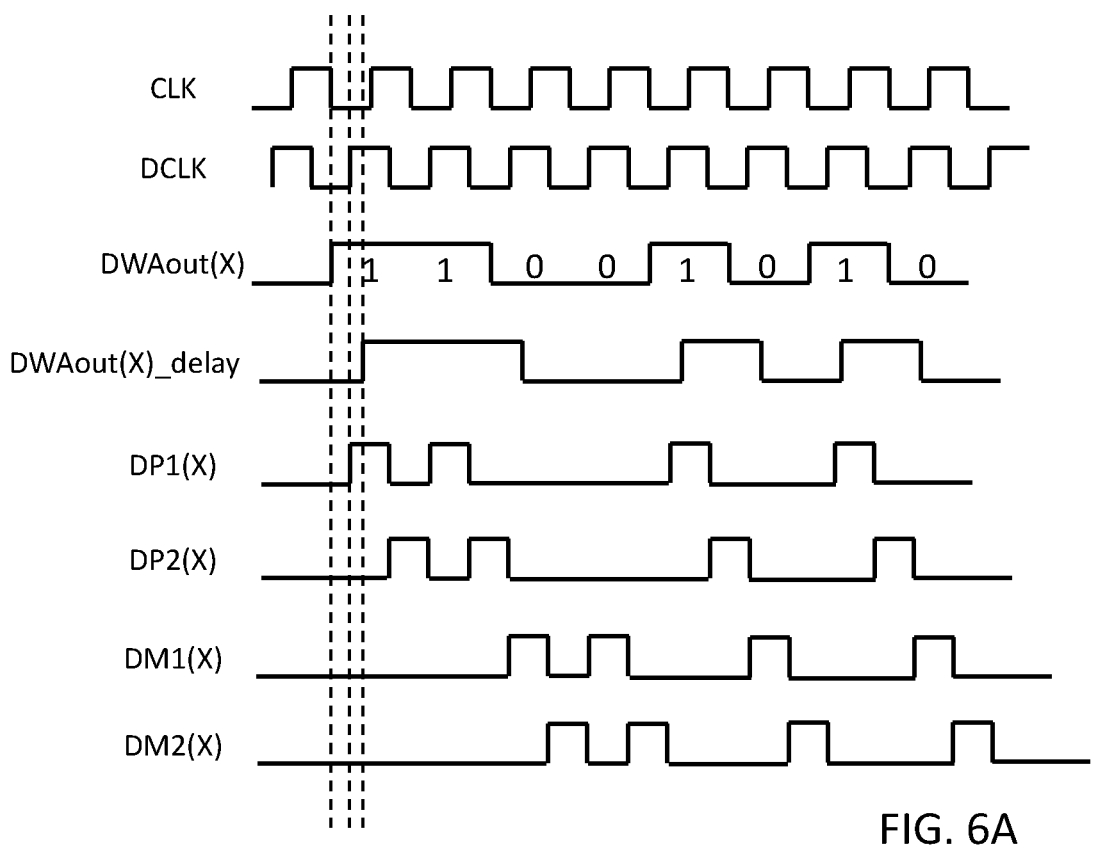
FIG. 6A is a timing diagram illustrating the double data rate (DDR) quad switching operation of the quad signal generator circuit of FIG. 5.
Figure 6B:
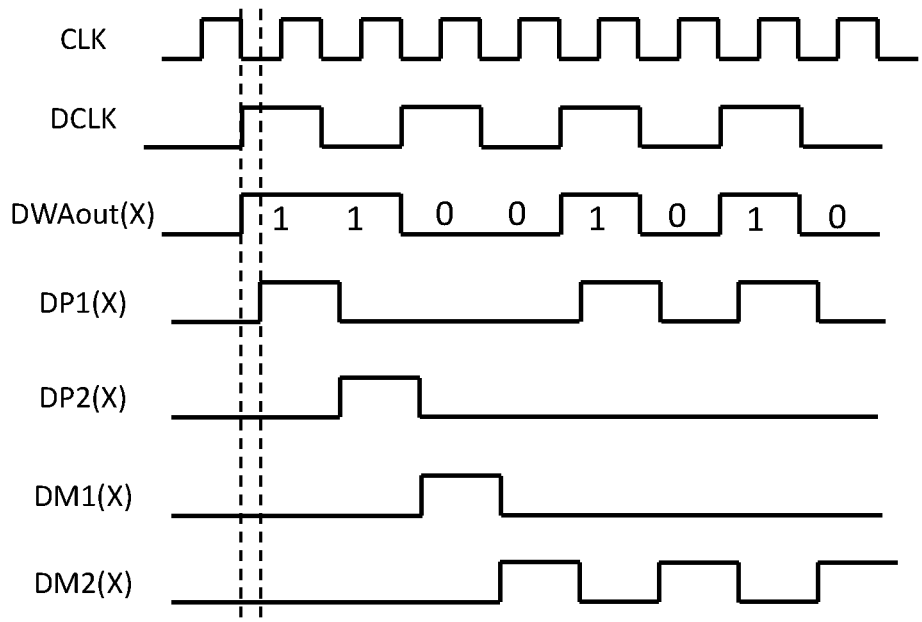
FIG. 6B is a timing diagram illustrating a half data rate (HDR) quad switching operation.

FIG. 6A shows a timing diagram for operation of the quad signal generator circuit 104 operating to provide for double data rate (DDR) quad switching with respect to an example data signal of <11001010>. For comparison purposes, FIG. 6B shows a timing diagram for the same data signal in using half data rate (HDR) quad switching.

To summarize, a quad signal generator circuit generates four $2^N$-1 bit control signals in response to a $2^N$-1 bit thermometer coded signal. A digital-to-analog converter (DAC) circuit has $2^N-1$ unit DAC elements, with each unit DAC element including four resistors and four switching circuits controlled by corresponding bits of the four $2^N-1$ bit control signals. Outputs of the $2^N-1$ unit DAC elements are summed to generate an analog output signal. The quad signal generator circuit controls a time delay applied to clock signals relative to the $2^N-1$ bit thermometer coded signal and a time delay applied to the $2^N-1$ bit thermometer coded signal relative to the delayed clock signals in logically generating the four $2^N-1$ bit control signals. The analog output signal may be a feedback signal in a sigma-delta analog-to-digital converter (ADC) circuit that includes a multi-bit quantization circuit operating to quantize a filtered loop signal to generate the $2^N-1$ bit thermometer coded signal.

The outputs of the $2^N-1$ unit DAC elements are summed at virtual ground nodes of first and third integrators of a third order four-bit CIFFB continuous time Sigma Delta modulator. The multi bit quantizer and DAC are used in a Sigma Delta ADC to achieve higher SQNR at low OSR as well as to reduce jitter noise.

The multi bit DAC non linearity increases noise floor as well as introduces harmonic distortions in ADC output. Hence, the dynamic performances (SNR, SFDR, THD) of the ADC is severely degraded. To provide for a more linear multi bit DAC linear, DWA is used to minimize the effects of mismatch in DAC elements. With DWA, the DAC elements are switched at every rising edge of the clock. Due to DWA, the data dependent switching is significantly higher, and as a result increased the noise floor and introduced distortions in the modulator output spectrum. The double data rate (DDR) quad switched multi bit DAC and quad signal generation(to have minimum delay to minimize the ELD effects and no glitches) in order to achieve excellent dynamic performance of about 100 dB.

Although disclosed herein in the context of a continuous time delta sigma modulator, it will be understood that the disclosed circuit and operation herein is also applicable to discrete time modulators.

While the invention has been illustrated and described in detail in the drawings and foregoing description, such illustration and description are considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

What is claimed is:

1. A circuit, comprising:
   a digital-to-analog converter (DAC) circuit having $2^N-1$ unit resistive DAC elements, wherein each unit resistive DAC element includes four switching circuits controlled by corresponding bits of four $2^N-1$ bit control signals, and wherein outputs of the $2^N-1$ unit resistive DAC elements are summed to generate an analog output signal; and
   a quad signal generator circuit configured to generate the four $2^N-1$ bit control signals in response to a $2^N-1$ bit thermometer coded input signal, wherein the quad signal generator circuit comprises:
      a clock phase circuit configured to generate first and second clock signals that are 180° out of phase with each other and apply a first delay to set clock edges of the first and second clock signals to trail logic switching of the $2^N-1$ bit thermometer coded input signal;
      a first circuit configured to logically combine the $2^N-1$ bit thermometer coded input signal with the first clock signal to generate a first one of the four $2^N-1$ bit control signals;
      a second circuit configured to logically combine a delay of the $2^N-1$ bit thermometer coded input signal with the second clock signal to generate a second one of the four $2^N-1$ bit control signals, wherein the second circuit applies a second delay to set the logic switching of the delayed $2^N-1$ bit thermometer coded input signal to trail the clock edges of the first and second clock signals;
      a third circuit configured to logically combine a logical inversion of the $2^N-1$ bit thermometer coded input signal with the first clock signal to generate a third one of the four $2^N-1$ bit control signals; and
      a fourth circuit configured to logically combine a delay of the logical inversion of the $2^N-1$ bit thermometer coded input signal with the second clock signal to generate a fourth one of the four $2^N-1$ bit control signals, wherein the fourth circuit applies a third delay to set the logic switching of the delayed logical inversion of the $2^N-1$ bit thermometer coded input signal to trail the clock edges of the first and second clock signals.

2. The circuit of claim 1, wherein the clock phase circuit of the quad signal generator circuit further applies a frequency division to frequency divide a sampling clock having clock edges aligned with logic switching of the $2^N-1$ bit thermometer coded input signal to generate the first and second clock signals.

3. The circuit of claim 2, wherein the frequency division is divide by two.

4. The circuit of claim 1, wherein the clock phase circuit of the quad signal generator circuit derives the first and second clock signals from a sampling clock having clock edges aligned with logic switching of the $2^N-1$ bit thermometer coded input signal.

5. The circuit of claim 4, wherein the first delay is less than one half of a clock period of the sampling clock.

6. The circuit of claim 5, wherein the second and third delays are each less than one half of the clock period of the sampling clock.

7. The circuit of claim 6, wherein a sum of the first delay and one of the second and third delays is less than one half of the clock period of the sampling clock.

8. The circuit of claim 4, wherein the second and third delays are equal.

9. The circuit of claim 4, wherein the second and third delays are each less than one half of a clock period of the sampling clock.

10. The circuit of claim 1, wherein each switching circuit of said four switching circuits of each unit resistive DAC element comprises:
   a first switching circuit configured to switch a first common node between a first and second reference voltages in response to said third one of the four $2^N-1$ bit control signals and a logical inversion of said first one of the four $2^N-1$ bit control signals;
   a second switching circuit configured to switch a second common node between the first and second reference voltages in response to the fourth one of the four $2^N-1$ bit control signals and a logical inversion of the second one of the four $2^N-1$ bit control signals;
   a third switching circuit configured to switch a third common node between the first and second reference voltages in response to the first one of the four $2^N-1$ bit control signals and a logical inversion of the third one of the four $2^N$-1 bit control signals; and a fourth switching circuit configured to switch a fourth common node between the first and second reference voltages in response to the second one of the four $2^N$-1 bit control signals and a logical inversion of the fourth one of the four $2^N$-1 bit control signals.

11. The circuit of claim 10, further comprising:

a first resistive circuit coupled between the first common node and a first summing output node for providing a first component of the analog output signal;

a second resistive circuit coupled between the second common node and the first summing output node for providing the first component of the analog output signal;

a third resistive circuit coupled between the third common node and a second summing output node for providing a second component of the analog output signal; and a fourth resistive circuit coupled between the fourth common node and the second summing output node for providing the second component of the analog output signal.

12. The circuit of claim 11, wherein the first and second components are differential currents of the analog output signal.

13. The circuit of claim 1, wherein the $2^N$-1 bit thermometer coded input signal is generated with data weighted averaging (DWA).

14. The circuit of claim 13, further including a DWA circuit configured to apply data weighted averaging to a received $2^N$-1 bit thermometer coded signal in order to generate the $2^N$-1 bit thermometer coded input signal.

15. The circuit of claim 14, further including a multi-bit quantization circuit configured to generate the $2^N$-1 bit thermometer coded signal.

16. The circuit of claim 1, further comprising a loop filter circuit configured to generate a difference signal from a difference between an analog input signal and said analog output signal and filter the difference signal to generate a change signal.

17. The circuit of claim 16, further comprising a multi-bit quantization circuit configured to quantize the change signal and generate a $2^N$-1 bit thermometer coded signal from which the $2^N$-1 bit thermometer coded input signal is generated.

18. The circuit of claim 17, further comprising a data weighted averaging (DWA) circuit configured to apply data weighted averaging to the $2^N$-1 bit thermometer coded signal in order to generate the $2^N$-1 bit thermometer coded input signal.

19. The circuit of claim 1, wherein the first delay is less than one half of a clock period of the first and second clock signals.

20. The circuit of claim 19, wherein the second and third delays are each less than one half of the clock period of the first and second clock signals.

21. The circuit of claim 20, wherein a sum of the first delay and one of the second and third delays is less than one half of the clock period of the first and second clock signals.

22. The circuit of claim 1, wherein the second and third delays are equal.

23. The circuit of claim 1, wherein the second and third delays are each less than one half of a clock period of the first and second clock signals.

* * * * *